(12) United States Patent
Cheng

(10) Patent No.: US 10,147,470 B2
(45) Date of Patent: Dec. 4, 2018

(54) SEMICONDUCTOR MEMORY DEVICE CAPABLE OF PERFORMING READ OPERATION AND WRITE OPERATION SIMULTANEOUSLY

(71) Applicant: UNITED MICROELECTRONICS CORP., Hsin-Chu (TW)

(72) Inventor: Chung-Hao Cheng, Taoyuan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/456,602

(22) Filed: Mar. 13, 2017

(65) Prior Publication Data

US 2017/0263294 A1   Sep. 14, 2017

Related U.S. Application Data

(62) Division of application No. 15/131,034, filed on Apr. 18, 2016, now Pat. No. 9,633,712.

(30) Foreign Application Priority Data

Mar. 11, 2016   (CN) .......................... 2016 1 0139720

(51) Int. Cl.
  *G11C 14/00*   (2006.01)
  *G11C 7/12*   (2006.01)
  *G11C 11/409*   (2006.01)
  *G11C 5/06*   (2006.01)

(52) U.S. Cl.
  CPC .................. *G11C 7/12* (2013.01); *G11C 5/06* (2013.01); *G11C 11/409* (2013.01); *G11C 14/0009* (2013.01); *G11C 14/0018* (2013.01)

(58) Field of Classification Search
  CPC ....................................................... G11C 14/00
  USPC ..................................................... 365/185.08
  See application file for complete search history.

(56) References Cited

U.S. PATENT DOCUMENTS

| 5,065,362 A | 11/1991 | Herdt |
| 5,963,497 A * | 10/1999 | Holland ................ G11C 11/406 |
| | | 365/149 |
| 6,181,620 B1 | 1/2001 | Agata |
| 6,954,377 B2 | 10/2005 | Choi |
| 2005/0029551 A1* | 2/2005 | Atwood ............... G11C 7/1039 |
| | | 257/208 |
| 2006/0221746 A1 | 10/2006 | Kang |

(Continued)

OTHER PUBLICATIONS

Texas Instrument, RTC Module With 512K×8 NVSRAM, data sheet of bq4850Y, Jan. 2005.

*Primary Examiner* — Hoai V Ho
(74) *Attorney, Agent, or Firm* — Winston Hsu

(57) ABSTRACT

A semiconductor memory device includes a charge storage element, a read transistor, and a write transistor. The charge storage element is for preserving a first data voltage. The read transistor has a first terminal coupled to the charge storage element, a second terminal coupled to a read bit line, and a control terminal coupled to a read word line. The write transistor has a first terminal coupled to the first terminal of the read transistor, a second terminal coupled to a write bit line, and a control terminal coupled to a write word line. The semiconductor memory device is able to perform a read operation and a write operation to the charge storage element simultaneously through the read transistor and the write transistor.

5 Claims, 11 Drawing Sheets

(56) References Cited

U.S. PATENT DOCUMENTS

| | | | |
|---|---|---|---|
| 2009/0010055 A1* | 1/2009 | Kang | G11C 11/405 |
| | | | 365/182 |
| 2009/0190402 A1 | 7/2009 | Hsu | |
| 2013/0100750 A1 | 4/2013 | Ishiguro | |
| 2014/0119118 A1 | 5/2014 | Lee | |
| 2015/0043270 A1 | 2/2015 | Singh | |
| 2016/0078938 A1 | 3/2016 | Hsu | |

\* cited by examiner

SEMICONDUCTOR MEMORY DEVICE CAPABLE OF PERFORMING READ OPERATION AND WRITE OPERATION SIMULTANEOUSLY

CROSS REFERENCE TO RELATED APPLICATIONS

This application is a division of U.S. application Ser. No. 15/131,034, which was filed on Apr. 18, 2016 and is entitled "SEMICONDUCTOR MEMORY DEVICE CAPABLE OF PERFORMING READ OPERATION AND WRITE OPERATION SIMULTANEOUSLY", and is included herein by reference.

BACKGROUND OF THE INVENTION

1. Field of the Invention

This invention is related to a semiconductor memory device, especially related to a semiconductor memory device capable of performing read operation and write operation simultaneously.

2. Description of the Prior Art

Since the speed of read operations or write operations of the dynamic random access memory (DRAM) is faster than the speed of read operations or write operations of the static random access memory (SRAM) and the circuit structure of the dynamic random access memory is rather simpler, which requires smaller circuit area, the dynamic random access memory has been widely used in all kinds of systems.

However, after the dynamic random access memory performs a read operation, charges stored in the dynamic random access memory may dissipate gradually. Therefore, a rewrite operation for recharging is required. If the rewrite operation is required each time after a read operation, the time for the next read operation of the dynamic random access memory may be delayed, that is, the time required by a whole read operation is increased.

In addition, after the system is powered off, the charges stored in the dynamic random access memory will be dissipated, and the dynamic random access memory is not able to keep storing the data, which can cause inconvenience to the users sometimes. Therefore, how to reduce the time gap between successive read operations for increasing the speed of the whole read operation of the semiconductor memory device, and how to make the semiconductor memory device be capable of maintaining the stored data when the system is powered off while not to increase the circuit area significantly have both become issues of the prior art to be solved.

SUMMARY OF THE INVENTION

One embodiment of the present invention discloses a semiconductor memory device. The semiconductor memory device includes a first charge storage element, a first read transistor, and a first write transistor. The first charge storage element maintains a first data voltage. The first read transistor has a first terminal coupled to the first charge storage element, a second terminal coupled to the first read bit line, and a control terminal coupled to a read word line. The first write transistor has a first terminal coupled to the first terminal of the first read transistor, a second terminal coupled to a first write bit line, and a control terminal coupled to a write word line.

Another embodiment of the present invention discloses a method for operating a semiconductor memory device. The semiconductor memory device includes a first charge storage element, a first read transistor, and a first write transistor.

The first read transistor has a first terminal coupled to the first charge storage element, a second terminal coupled to a first reading bit line, and a control terminal coupled to a read word line. The first write transistor has a first terminal coupled to the first charge storage element, a second terminal coupled to a first write bit line, and a control terminal coupled to a write word line.

The method includes controlling the read word line to turn on the first read transistor and controlling the write word line to turn on the first write transistor for performing a program operation and a read operation to the first charge storage element simultaneously.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
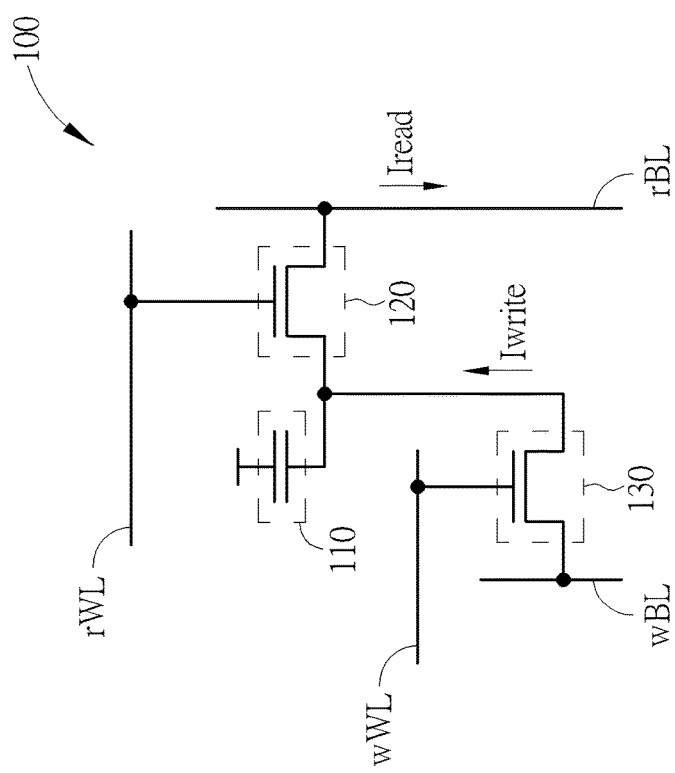
FIG. 1 shows a semiconductor memory device according to one embodiment of the present invention.

FIG. 1 shows a semiconductor memory device 100 according to one embodiment of the present invention. The semiconductor memory device 100 includes a first charge storage element 110, a first read transistor 120, and a first write transistor 130.

In FIG. 1, the first read transistor 120 has a first terminal, a second terminal, and a control terminal. The first terminal of the first read transistor 120 is coupled to the first charge storage element 110, the second terminal the first read transistor 120 is coupled to the first read bit line rBL, and the control terminal the first read transistor 120 is coupled to a read word line rWL. The first write transistor 130 has a first terminal, a second terminal, and a control terminal. The first terminal of the first write transistor 130 is coupled to the first terminal of the first read transistor 120, the second terminal of the first write transistor 130 is coupled to a first write bit line wBL, and the control terminal of the first write transistor 130 is coupled to a write word line wWL.

When the semiconductor memory device 100 performs a write operation to the first charge storage element 110, the semiconductor memory device 100 may charge the write bit line wBL to a first data voltage according to the data to be written, and control the voltage of the write word line wWL to turn on the first write transistor 130. In this case, the first write transistor 130 can generate a write current $I_{write}$ to the first charge storage element 110 according to the data voltage of the write bit line wBL, and the first charge storage element 110 can store the charges and maintain the first data voltage. In addition, when the semiconductor memory device 100 performs a read operation to the first charge storage element 110, the semiconductor memory device 100 may pre-charge the read bit line rBL to a reference voltage to reduce the time for identifying the read data. Then, the semiconductor memory device 100 may control the voltage of the read word line rWL to turn on the first read transistor 120. In this case, the first read transistor 120 can generate a read current $I_{read}$ according to the first data voltage maintained by the first charge storage element 110. Therefore, the data stored in the semiconductor memory device 100 can be identified according to the read current.

Furthermore, in some embodiments of the present invention, the semiconductor memory device 100 can perform the read operation and the write operation at the same time. For example, when identifying the stored data of the semiconductor device 100 according to the read current $I_{read}$, the semiconductor memory device 100 may turn on the first write transistor 130 to generate the write current $I_{write}$ according to the stored data. In this case, before the read operation is completed, the semiconductor memory device 100 may perform the read operation and the write operation at the same time. Therefore, after the read operation is completed, the time for rewrite operation of the semiconductor memory device 100 can be reduced and the time gap between successive read operations of the semiconductor memory device 100 can be reduced.

In addition, the first charge storage element 110 can be a capacitor element. In the embodiment of FIG. 1, the first charge storage element 110 can be a parallel-plate capacitor; however, in some embodiments of the present invention, the first charge storage element 110 can also be a transistor capacitor so that the first charge storage element 110 can be manufactured with other transistors under the same process, which further simplifies the manufacturing process. In addition, the first charge storage element 110 can also be a trench capacitor or a stack capacitor in some embodiments.

Figure 2:
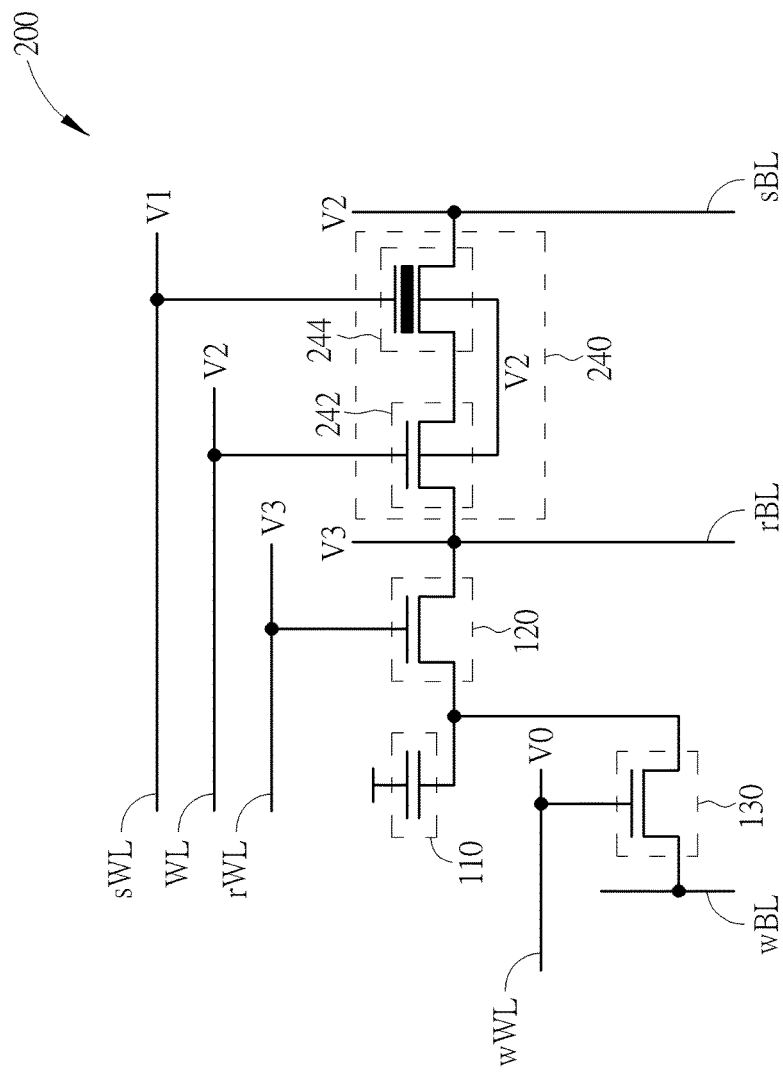
FIG. 2 shows a semiconductor memory device according to another embodiment of the present invention.

FIG. 2 shows a semiconductor memory device 200 according to another embodiment of the present invention. The semiconductor memory device 200 and the semiconductor memory device 100 have similar structures and similar operation principles. The difference between these two is in that the semiconductor memory device 200 further includes a non-volatile memory cell 240. The non-volatile memory cell 240 can maintain the stored data even when the semiconductor memory device 200 is powered off. The non-volatile memory cell 240 is coupled to the second terminal of the first read transistor 120, a non-volatile control line sWL, a non-volatile word line WL, and a non-volatile bit line sBL. The non-volatile memory cell 240 can program or read non-volatile bit data according to signals transmitted from the non-volatile control line sWL, the non-volatile word line WL, and the non-volatile bit line sBL. In some embodiments of the present invention, before a system including the semiconductor memory device 200 is powered off, the semiconductor memory device 200 can perform the program operation to the non-volatile memory cell 240 according to the data voltage stored in the first charge storage element 110. That is, the data can be stored to the non-volatile memory cell 240 before the system is powered off so that the data stored in the semiconductor memory device 200 will not be lost even when the semiconductor memory device 200 is powered off.

In some embodiments, after the semiconductor memory device 200 is reconnected to the power source and is powered on again, the data stored in the first charge storage element 110 before the system is powered off can be written to the first charge storage element 110 again through the first write transistor 130 according the data stored in the non-volatile memory cell 240. Therefore, comparing to the prior art, the semiconductor memory device 200 is not only able to perform the read operation faster, but also able to maintain the data when the system is powered off.

In addition, in some embodiments, since the non-volatile memory cell 240, the first charge storage element 110, the first read transistor 120, and the first write transistor 130 can share parts of the circuits, the circuit area will not increase significantly. In FIG. 2, the non-volatile memory cell 240 includes control transistor 242 and a non-volatile memory transistor 244. The control transistor 242 can be an N-type metal-oxide-semiconductor field effect transistor, and the non-volatile memory transistor 244 can be a floating gate transistor. The control transistor 242 has a first terminal, a second terminal, a control terminal, and a body terminal. The first terminal of the control transistor 242 is coupled to the second terminal of the first read transistor 120, and the control terminal of the control transistor 242 is coupled to the non-volatile word line WL. The non-volatile memory transistor 244 has a firs terminal, a second terminal, a control terminal, and a body terminal. The first terminal of the non-volatile memory transistor 244 is coupled to the second terminal of the control transistor 242, the second terminal of the non-volatile memory transistor 244 is coupled to the non-volatile bit line sBL, the control terminal of the non-volatile memory transistor 244 is coupled to the non-volatile control line sWL, and the body terminal of the non-volatile memory transistor 244 is coupled to the body terminal of the control transistor 242.

FIG. 2 also shows the signal voltages received by the semiconductor 200 during the program operation of the non-volatile memory cell 240. When the semiconductor 200 performs the program operation to the non-volatile memory cell 240, the semiconductor 200 can input a first voltage V1 to the non-volatile control line sWL, input a second voltage V2 to the non-volatile bit line sBL, input the second voltage V2 to the non-volatile word line WL, input a third voltage V3 to the read bit line rBL, and input the second voltage V2 to the body terminal of the control transistor 242. Also, the semiconductor 200 can control the voltage of the read word line rWL to turn off the first read transistor 120 and control the voltage of the write word line wWL to turn off the first write transistor 130. The first voltage V1 is greater than the third voltage V3, and the third voltage V3 is greater than or equal to the second voltage V2. In some embodiments, the first voltage V1 can be 4.0V, the second voltage V2 can be −3.6V, and the third voltage V3 can be −2.4V. Consequently, the big positive voltage between the control terminal of the non-volatile memory transistor 244 and the body terminal of the non-volatile memory transistor 244 can induce the electron tunneling injection so that the non-volatile memory transistor 244 is able to capture and store electrons and the non-volatile memory cell 240 can be programmed.

In some embodiments, the first read transistor 120 and the first write transistor 130 can be N-type metal-oxide-semiconductor field effect transistors. In this case, the semiconductor 200 may input the third voltage V3 (the same voltage received by the read bit line rBL) to the read word line rWL to turn off the first read transistor 120, and may input the ground voltage V0, such as 0V, to the write word line wWL to turn off the first write transistor 130.

Figure 3:
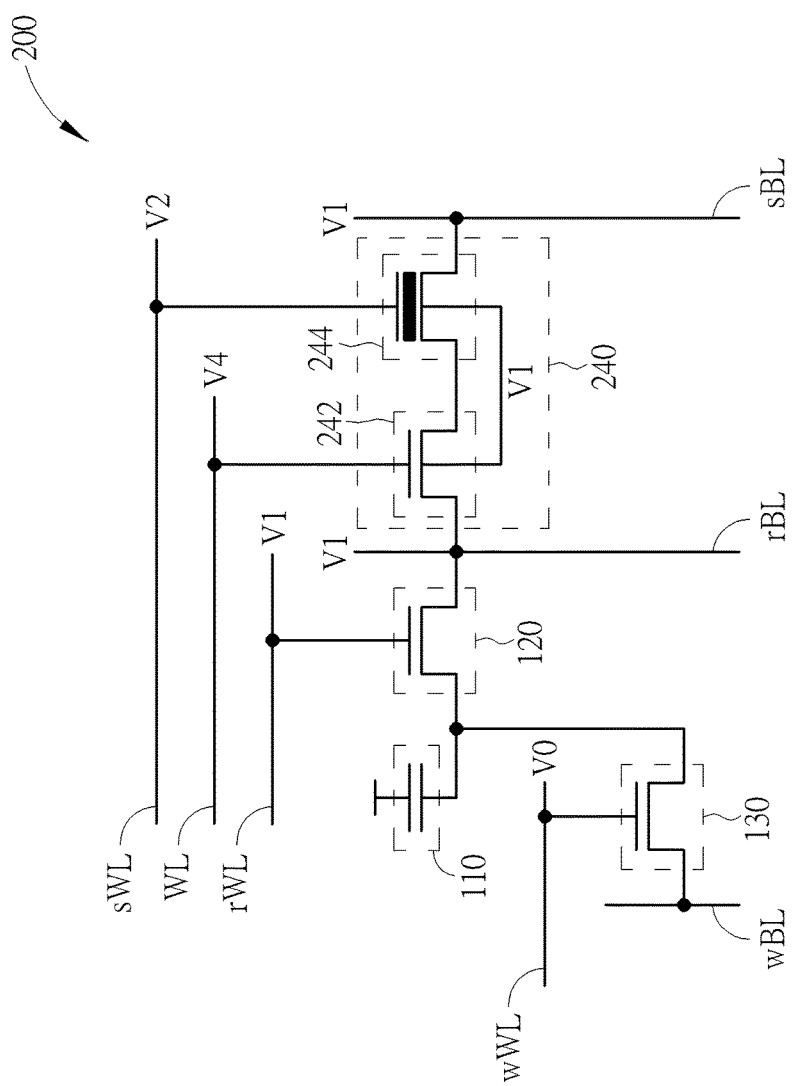
FIG. 3 shows the signal voltages received by the semiconductor in FIG. 2 during the erase operation of the non-volatile memory cell.

FIG. 3 shows the signal voltages received by the semiconductor 200 during the erase operation of the non-volatile memory cell 240. When the semiconductor 200 performs the erase operation to the non-volatile memory cell 240, the semiconductor 200 can input the first voltage V1 to the non-volatile bit line sBL, input the second voltage V2 to the non-volatile control line sWL, input a fourth voltage V4 to the non-volatile word line WL, input the first voltage V1 to the read bit line rBL, and input the first voltage V1 to the body terminal of the control transistor 242. Also, the semiconductor 200 can control the voltage of the read word line rWL to turn off the first read transistor 120 and control the voltage of the write word line wWL to turnoff the first write transistor 130. The fourth voltage V4 is smaller than the first voltage V1 but greater than the second voltage V2. In some embodiments, the fourth voltage V4 can be 1.2V. Consequently, the big negative voltage between the control terminal of the non-volatile memory transistor 244 and the body terminal of the non-volatile memory transistor 244 can induce the electron tunneling ejection so that the non-volatile memory transistor 244 is able to release the electrons and the non-volatile memory cell 240 can be erased.

Furthermore, since the read bit line rBL is at the first voltage V1, the first read transistor 120 can be turned off by inputting the first voltage V1 to the read word line rWL, and the first write transistor 130 can be turned off by inputting the ground voltage V0, such as 0V, to the write word line wWL.

Figure 4:
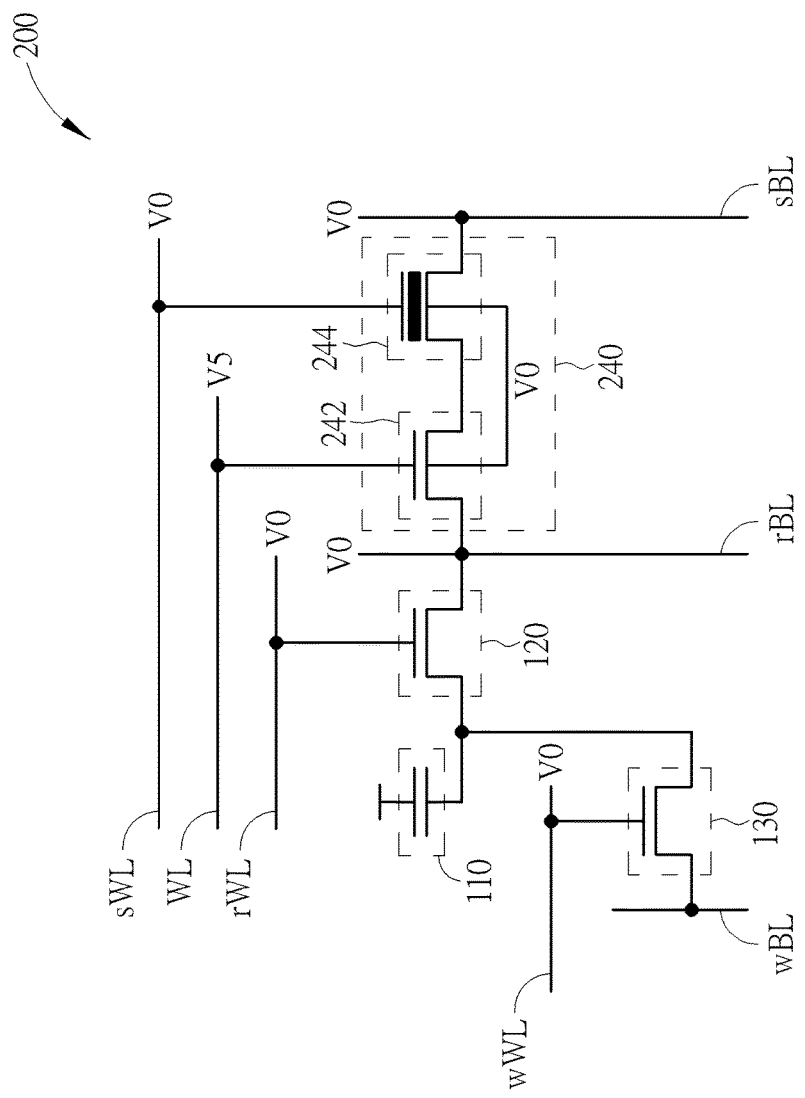
FIG. 4 shows the signal voltages received by the semiconductor in FIG. 2 during the read operation of the non-volatile memory cell.

FIG. 4 shows the signal voltages received by the semiconductor 200 during the read operation of the non-volatile memory cell 240. When the semiconductor 200 performs the read operation to the non-volatile memory cell 240, the semiconductor 200 can input the ground voltage V0 to the non-volatile control line sWL, input the fifth voltage V5 to the non-volatile word line WL, input the ground voltage V0 to the read bit line rBL, and input the ground voltage V0 to the body terminal of the control transistor 242. Also, the semiconductor 200 can control the voltage of the read word line rWL to turn off the first read transistor 120 and control the voltage of the write word line wWL to turn off the first write transistor 130. The fifth voltage V5 is greater than the ground voltage V0. In some embodiments, the fifth voltage V5 can be 2.5V. Consequently, the non-volatile control transistor 242 and the non-volatile memory transistor 244 can generate the read current according to the charges stored in the non-volatile memory transistor 244, and can output the read current to the non-volatile bit line sBL.

Furthermore, since the read bit line rBL is at the ground voltage V0, the first read transistor 120 can be turned off by inputting the ground voltage V0 to the read word line rWL, and the first write transistor 130 can be turned off by inputting the ground voltage V0, such as 0V, to the write word line wWL.

Figure 5:
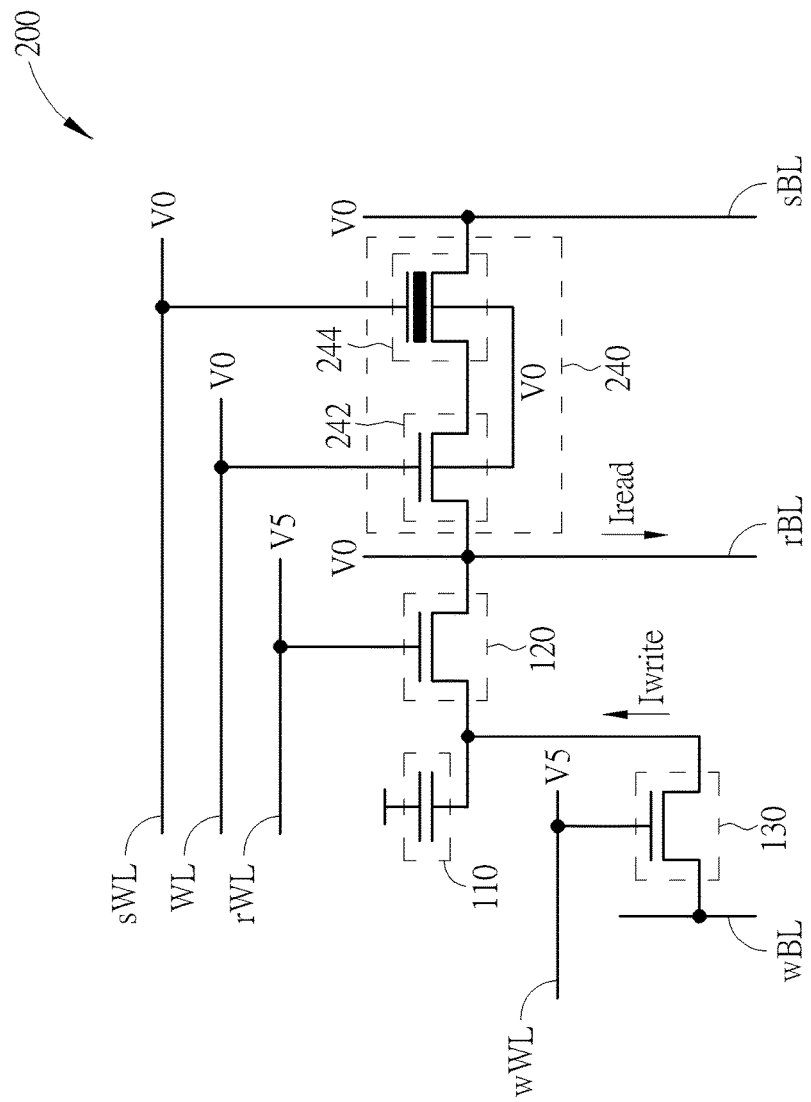
FIG. 5 shows the signal voltages received by the semiconductor in FIG. 2 during the read or write operation of the first charge storage element.

FIG. 5 shows the signal voltages received by the semiconductor 200 during the read or write operation of the first charge storage element 110. When the semiconductor 200 performs the read or write operation to the first charge storage element 110, the semiconductor 200 may input the ground voltage V0 to the non-volatile control line sWL, the non-volatile word line WL, and the non-volatile bit line sBL so that the non-volatile memory cell 240 can remain at its previous state. In this case, the semiconductor memory device 200 can follow the same operation principles as the semiconductor memory device 100 to perform the read or write operations to the first charge storage element 110. For example, the semiconductor memory device 200 can input the fifth voltage V5, for example 2.5V, to the read word line rWL to turn on the first read transistor 120 for the read operation, and can input the fifth voltage V5, for example, 2.5V, to the write word line wWL to turn on the first write transistor 130.

Consequently, the semiconductor memory device 200 is not only able to reduce the time gap between two successive read operations for increasing the reading speed of the semiconductor memory device 200, but also able to maintain the stored data when the system is powered off without significantly increasing the circuit area, which also increases the flexibility of the semiconductor memory device 200.

Figure 6:
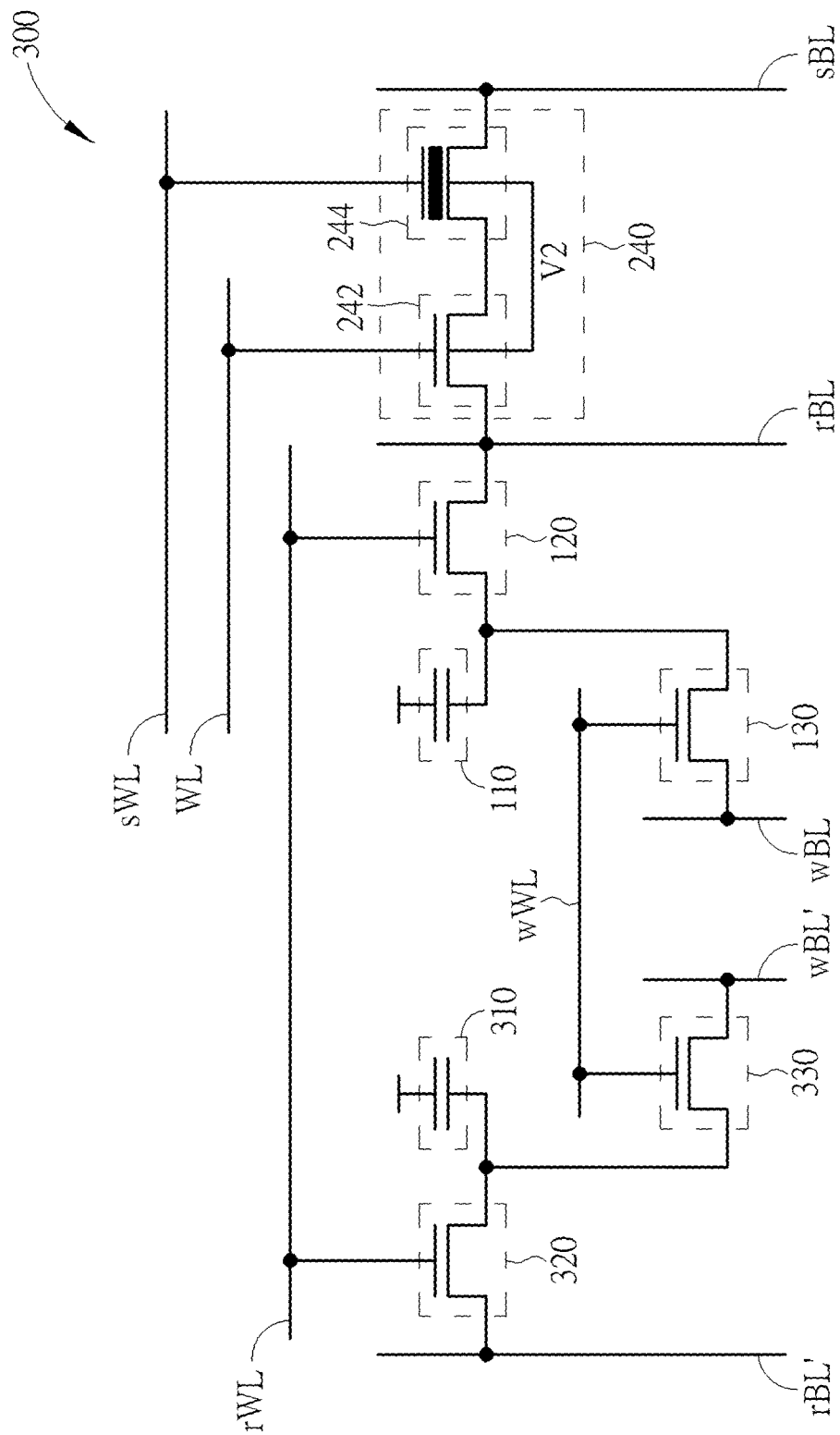
FIG. 6 shows a semiconductor memory device according to another embodiment of the present invention.

FIG. 6 shows a semiconductor memory device 300 according to one embodiment of the present invention. The semiconductor memory device 300 and the semiconductor memory device 200 have the similar structures and the similar operation principles. The main difference between these two is in that the semiconductor memory device 300 further includes a second charge storage element 310, a second read transistor 320 and a second write transistor 330.

The second read transistor 320 has a first terminal, a second terminal, and a control terminal. The first terminal of the second read transistor 320 is coupled to the second charge storage element 310, the second terminal of the second read transistor 320 is coupled to a second read bit line rBL', and the control terminal of the second read transistor 320 is coupled to the read word line rWL. The second write transistor 330 has a first terminal, a second terminal, and a control terminal. The first terminal of the second write transistor 330 is coupled to the first terminal of the second read transistor 320, the second terminal of the second write transistor 330 is coupled to a second write bit line wBL', and the control terminal of the second write transistor 330 is coupled to the write word line wWL.

The operation principles of the second charge storage element 310, the second read transistor 320, and the second write transistor 330 are same as the operation principles of the first charge storage element 110, the first read transistor 120, and the first write transistor 130. Also, because the control terminal of the first read transistor 120 and the control terminal of the second read transistor 320 are coupled to the same read word line rWL and the control terminal of the first write transistor 130 and the control terminal of the second write transistor 330 are coupled to the same write word line wWL, the semiconductor memory device 300 can perform the read operation and/or write operation to the first charge storage element 110 and the second charge storage element 310 at the same time. In some embodiments, the data voltages at the first write bit line wBL and the second write bit line wBL can be complementary to each other so that the first data voltage stored in the first charge storage element 110 and the second data voltage stored in the second charge storage element 310 are also complementary to each other. Consequently, a system including the semiconductor memory device 300 can read the first data voltage and/or the second data voltage according to the system requirement.

Figure 7:
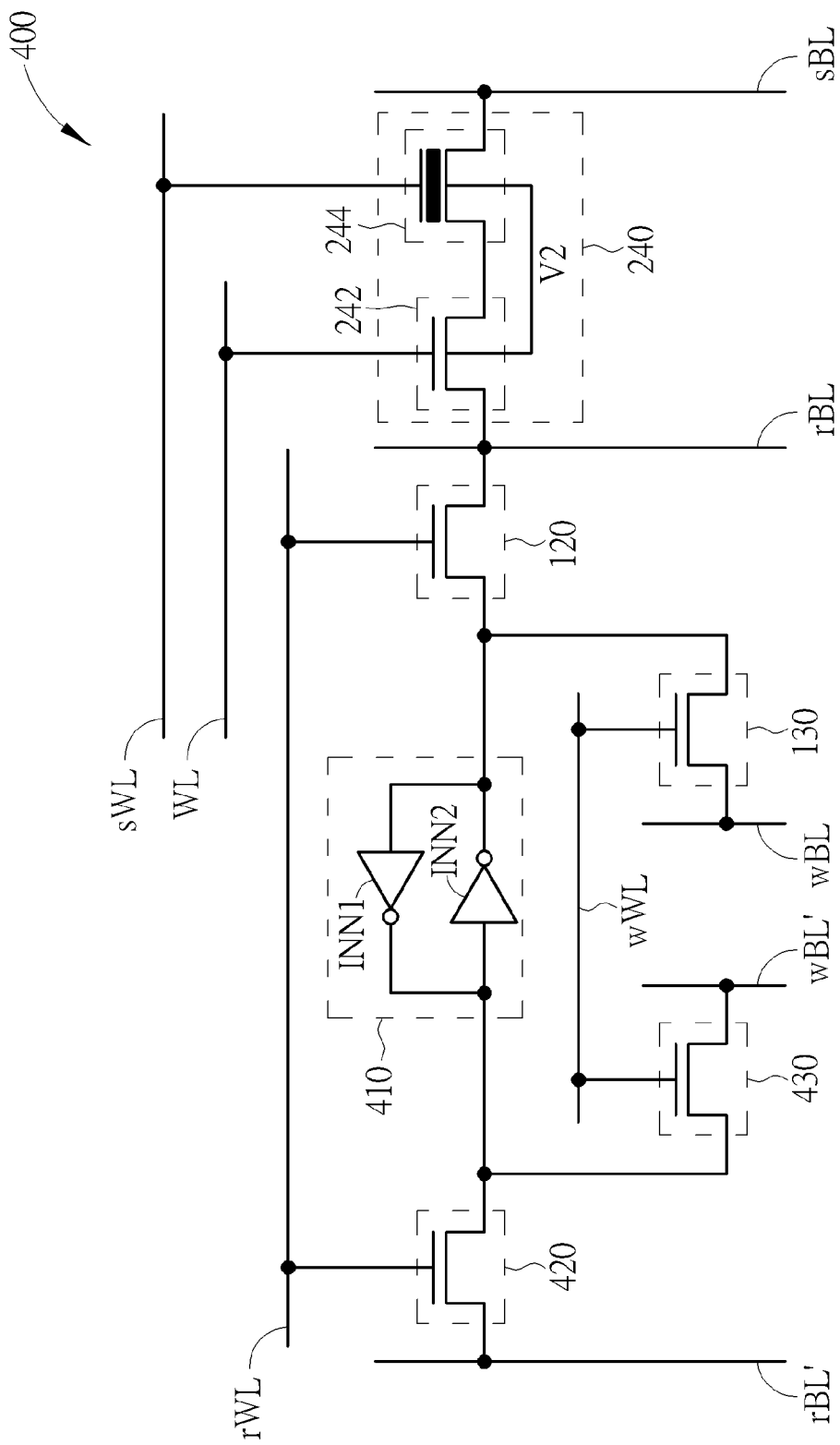
FIG. 7 shows a semiconductor memory device according to another embodiment of the present invention.

FIG. 7 shows a semiconductor memory device 400 according to one embodiment of the present invention. The semiconductor memory device 400 and the semiconductor memory device 200 have the similar structures and the similar operation principles. The main difference between these two is in that the semiconductor memory device 400 includes a second read transistor 420, a second write transistor 430, and a first charge storage element 410.

The second read transistor 420 has a first terminal, a second terminal, and a control terminal. The first terminal of the second read transistor 420 is coupled to the first charge storage element 410, the second terminal of the second read transistor 420 is coupled to the second read bit line rBL', and the control terminal of the second read transistor 420 is coupled to the read word line rWL. The second write transistor 430 has a first terminal, a second terminal, and a control terminal. The first terminal of the second write transistor 430 is coupled to the first terminal of the second read transistor 420, the second terminal of the second write transistor 430 is coupled to the second write bit line wBL', and the control terminal of the second write transistor 430 is coupled to the write word line wWL. The first charge storage element 410 includes a first inverter INV1 and a second inverter INV2. The first inverter INV1 has an input terminal and an output terminal. The input terminal of the first inverter INV1 is coupled to the first terminal of the first read transistor 120, and the output terminal of the first inverter INV1 is coupled to the first terminal of the second read transistor 420. The second inverter INV2 has an input terminal and an output terminal. The input terminal of the second inverter INV2 is coupled to the first terminal of the second read transistor 420, and the output terminal of the second inverter INV2 is coupled to the first terminal of the first read transistor 120.

Consequently, if the data voltage at the first write bit line wBL and the data voltage at the second write bit line wBL' are complementary to each other, then the first charge storage element 410 can be used to store the data voltage, and the first read transistor 120 and the second transistor 420 can read out the complementary data.

The semiconductor memory devices 300 and 400 are not only able to reduce the time gap between two successive read operations for increasing the reading speed of the semiconductor memory device 200, but also able to maintain the stored data when the system is powered off without significantly increasing the circuit area, which also increases the flexibility.

In addition, in some embodiments of the present invention, if the system does not need to maintain the stored data when powered off, the semiconductor memory devices 300 and 400 may not include the non-volatile memory cell 240.

Figure 8:
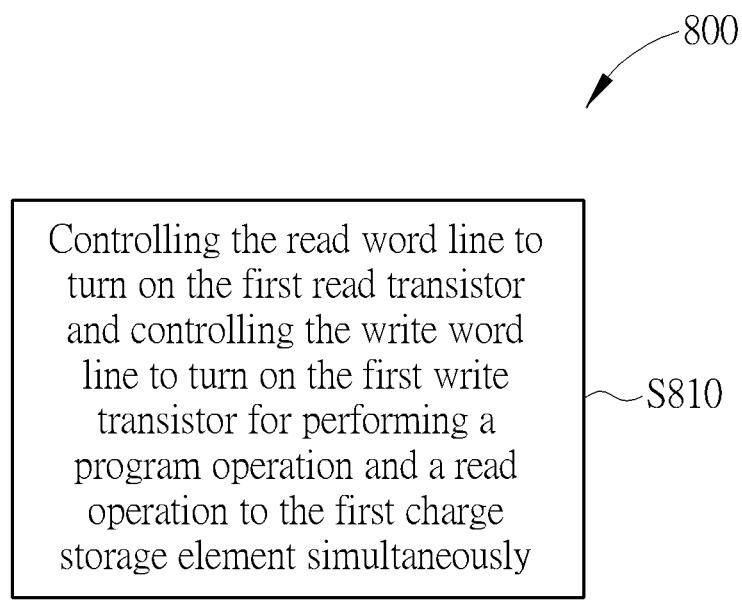
FIG. 8 shows a flow chart of a method for operating a semiconductor memory device according to one embodiment of the present invention.

FIG. 8 shows a flow chart of a method 800 for operating a semiconductor memory device. The method 800 can be applied to the semiconductor memory devices 100 to 400, and the method 800 includes step S810.

S810: controlling the read word line rWL to turn on the first read transistor 120 and controlling the write word line wWL to turn on the first write transistor 130 for performing a program operation and a read operation to the first charge storage element 110 simultaneously.

Furthermore, the method 800 can further include a step to pre-charge the read bit line rBL to a reference voltage before controlling the read word line rWL to turn on the first read transistor 120, and input a data voltage to the write bit line wBL when controlling the write word line wWL to turn on the first write transistor 130.

According the method 800, the semiconductor memory devices 100 to 400 can perform the read operation and the write operation to the charge storage element simultaneously, which reduces the time gap between two successive read operations and increases the reading speed of the semiconductor memory device 200.

Figure 9:
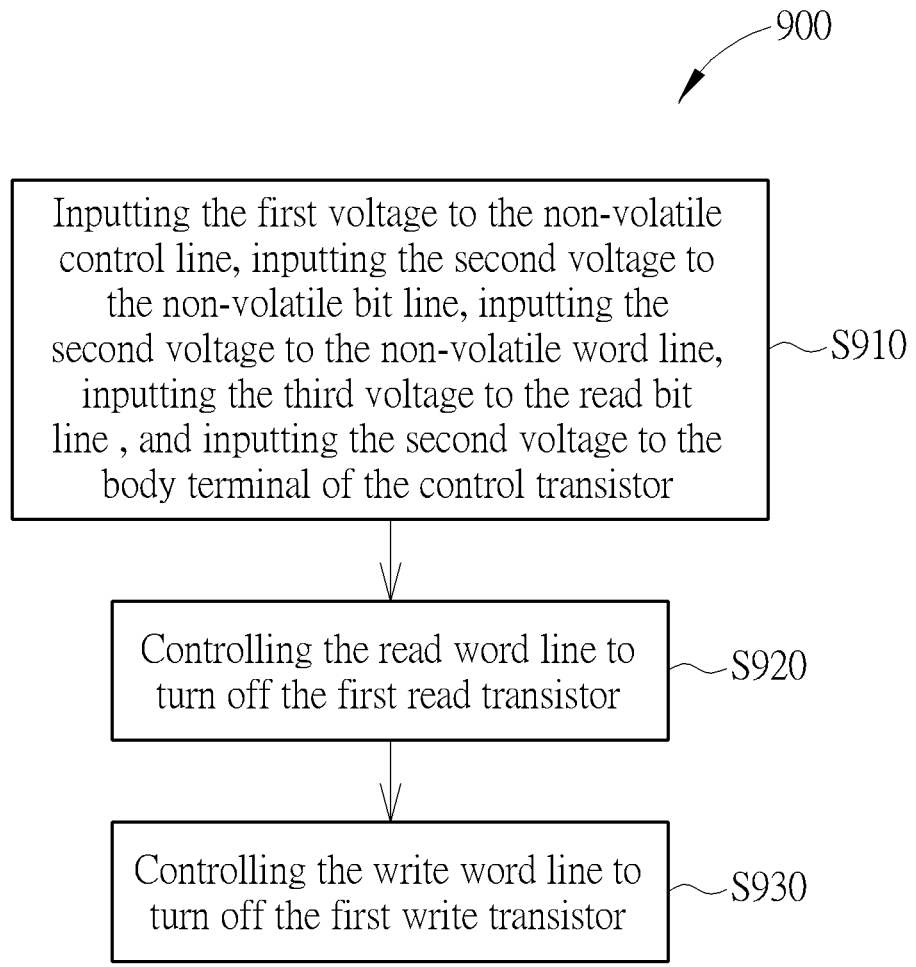
FIG. 9 shows a flow chart of a method for operating a semiconductor memory device according to another embodiment of the present invention.

FIG. 9 shows a flow chart of a method 900 for operating a semiconductor memory device. The method 900 can be applied to the semiconductor memory devices 200 to 400 to perform the program operation to the non-volatile memory cell 240. The method 900 includes steps S910 to S930, but is not limited to the order from S910 to S930.

S910: inputting the first voltage V1 to the non-volatile control line sWL, inputting the second voltage V2 to the non-volatile bit line sBL, inputting the second voltage V2 to the non-volatile word line WL, inputting the third voltage V3 to the read bit line rBL, and inputting the second voltage V2 to the body terminal of the control transistor 242;

S920: controlling the read word line rWL to turn off the first read transistor 120;

S930: controlling the write word line wWL to turn off the first write transistor 130.

Figure 10:
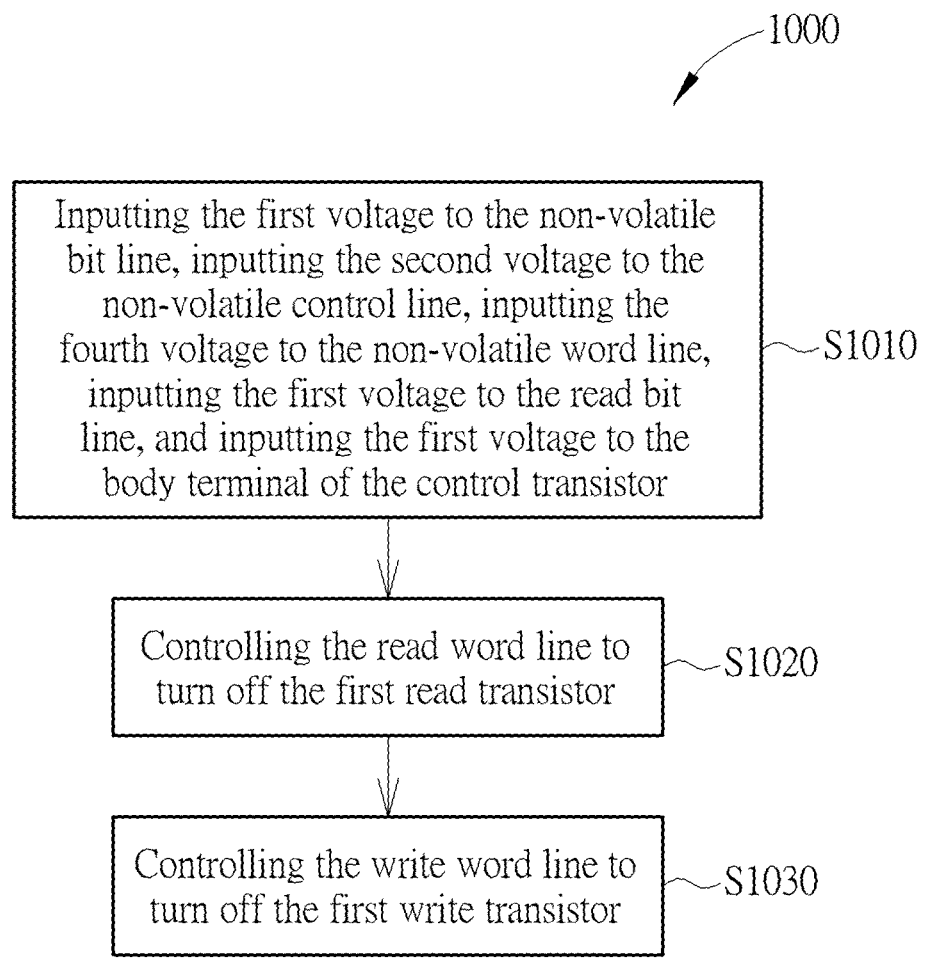
FIG. 10 shows a flow chart of a method for operating a semiconductor memory device according to another embodiment of the present invention.

FIG. 10 shows a flow chart of a method 1000 for operating a semiconductor memory device. The method 1000 can be applied to the semiconductor memory devices 200 to 400 to perform the erase operation to the non-volatile memory cell 240. The method 1000 includes steps S1010 to S1030, but is not limited to the order from s1010 to S1030.

S1010: inputting the first voltage V1 to the non-volatile bit line sBL, inputting the second voltage V2 to the non-volatile control line sWL, inputting the fourth voltage V4 to the non-volatile word line WL, inputting the first voltage V1 to the read bit line rBL, and inputting the first voltage V1 to the body terminal of the control transistor 242;

S1020: controlling the read word line rWL to turn off the first read transistor 120;

S1030: controlling the write word line wWL to turn off the first write transistor 130.

Figure 11:
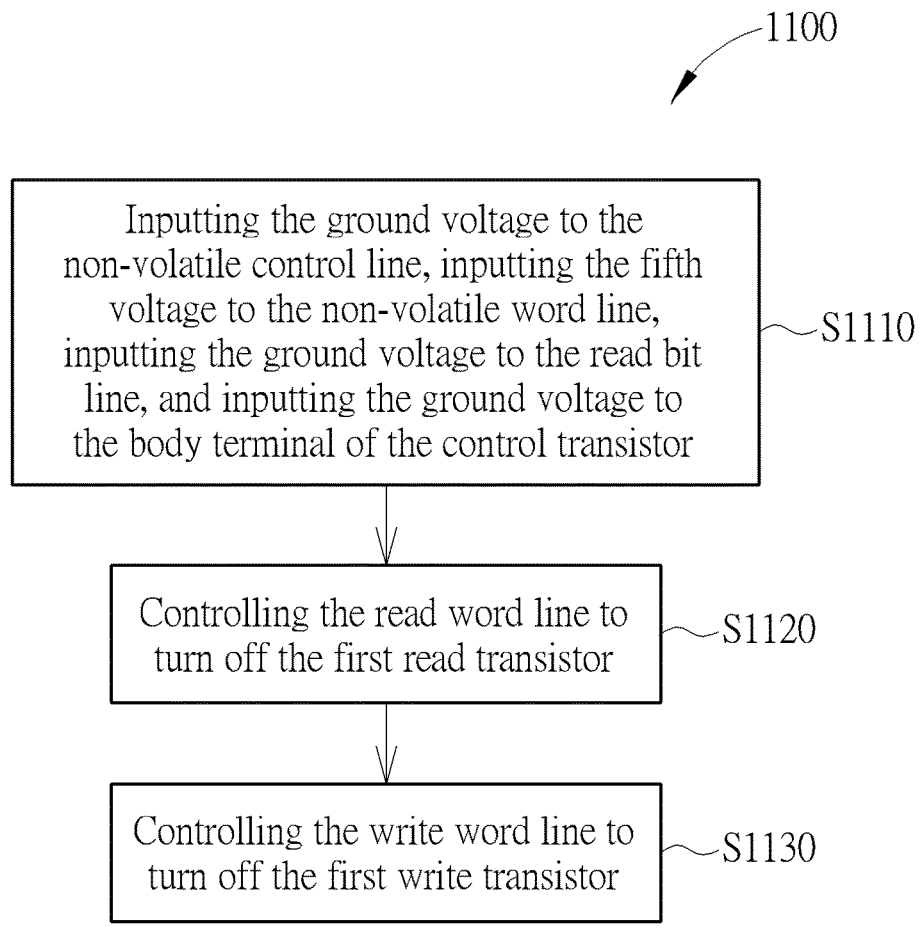
FIG. 11 shows a flow chart of a method for operating a semiconductor memory device according to another embodiment of the present invention.

FIG. 11 shows a flow chart of a method 1100 for operating a semiconductor memory device. The method 1100 can be applied to the semiconductor memory devices 200 to 400 to perform the erase operation to the non-volatile memory cell 240. The method 1100 includes steps S1110 to S1130, but is not limited to the order from S1110 to S1130.

S1110: inputting the ground voltage V0 to the non-volatile control line sWL, inputting the fifth voltage V5 to the non-volatile word line WL, inputting the ground voltage V0 to the read bit line rBL, and inputting the ground voltage V0 to the body terminal of the control transistor 242;

S1120: controlling the read word line rWL to turn off the first read transistor 120;

S1130: controlling the write word line wWL to turnoff the first write transistor 130.

According to the methods 900 to 1100, the semiconductor memory devices 200 to 400 can perform the program operation, the erase operation and the read operation to the non-volatile memory cell 240 so that the data stored in the semiconductor memory devices 200 to 400 will not be lost when the system is powered off, which further increase the flexibility of the semiconductor memory devices 200 to 400.

In summary, the semiconductor memory elements and the method for operating the semiconductor memory elements provided by the embodiments of the present invention are not only able to reduce the time gap between two successive read operations for increasing the reading speed of the semiconductor memory device 200, but also able to maintain the stored data when the system is powered off without significantly increasing the circuit area, which also increases the flexibility.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for operating a semiconductor memory device, the semiconductor memory device comprising a first charge storage element, a first read transistor, a first write transistor, and a non-volatile memory cell, the first read transistor having a first terminal coupled to the first charge storage element, a second terminal coupled to a first reading bit line, and a control terminal coupled to a read word line, the first write transistor having a first terminal coupled to the first charge storage element, a second terminal coupled to a first write bit line, and a control terminal coupled to a write word line, the non-volatile memory cell comprising a control transistor and a non-volatile memory transistor, the control transistor having a first terminal coupled to the second terminal of the first read transistor, a second terminal, a control terminal coupled to a non-volatile word line, and a body terminal, the non-volatile memory transistor having a first terminal coupled to the second terminal of the control transistor, a second terminal coupled to a non-volatile bit line, a control terminal coupled to a non-volatile control line, and a body terminal coupled to the body terminal of the control transistor, and the method comprising:
controlling the read word line to turn on the first read transistor for performing a read operation to the first charge storage element;
when data stored in the first charge storage element is identified during the read operation, controlling the write word line to turn on the first write transistor for performing a program operation to the first charge storage element before the read operation is completed; and
when performing a program operation to the non-volatile memory cell:
inputting a first voltage to the non-volatile control line, inputting a second voltage to the non-volatile bit line, inputting the second voltage to the non-volatile word line, inputting a third voltage to the read bit line, and inputting the second voltage to the body terminal of the control transistor;
controlling the read word line to turn off the first read transistor; and
controlling the write word line to turn off the first write transistor;
wherein the program operation to the first charge storage element is started before the read operation to the first charge storage element is completed so the read operation and the program operation are performed simultaneously during a period of time; and
wherein the first voltage is greater than the third voltage, and the third voltage is greater than or equal to the second voltage.

2. The method of claim 1, further comprising pre-charging the read bit line to a reference voltage before controlling the read word line to turn on the first read transistor.

3. The method of claim 1, further comprising:
inputting a data voltage to the write bit line when controlling the write word line to turn on the first write transistor.

4. A method for operating a semiconductor memory device, the semiconductor memory device comprising a first charge storage element, a first read transistor, a first write transistor, and a non-volatile memory cell, the first read transistor having a first terminal coupled to the first charge storage element, a second terminal coupled to a first reading bit line, and a control terminal coupled to a read word line, the first write transistor having a first terminal coupled to the first charge storage element, a second terminal coupled to a first write bit line, and a control terminal coupled to a write word line, the non-volatile memory cell comprising a control transistor and a non-volatile memory transistor, the control transistor having a first terminal coupled to the second terminal of the first read transistor, a second terminal, a control terminal coupled to a non-volatile word line, and a body terminal, the non-volatile memory transistor having a first terminal coupled to the second terminal of the control transistor, a second terminal coupled to a non-volatile bit line, a control terminal coupled to a non-volatile control line, and a body terminal coupled to the body terminal of the control transistor, and the method further comprising:
controlling the read word line to turn on the first read transistor for performing a read operation to the first charge storage element;
when data stored in the first charge storage element is identified during the read operation, controlling the write word line to turn on the first write transistor for performing a program operation to the first charge storage element before the read operation is completed; and
when performing an erase operation to the non-volatile memory cell:
inputting a first voltage to the non-volatile bit line, inputting a second voltage to the non-volatile control line, inputting a fourth voltage to the non-volatile word line, inputting the first voltage to the read bit line, and inputting the first voltage to the body terminal of the control transistor;
controlling the read word line to turn off the first read transistor; and
controlling the write word line to turn off the first write transistor;
wherein the program operation to the first charge storage element is started before the read operation to the first charge storage element is completed so the read operation and the program operation are performed simultaneously during a period of time; and
wherein the fourth voltage is smaller than the first voltage but greater than the second voltage.

5. A method for operating a semiconductor memory device, the semiconductor memory device comprising a first charge storage element, a first read transistor, a first write transistor, and a non-volatile memory cell, the first read transistor having a first terminal coupled to the first charge storage element, a second terminal coupled to a first reading bit line, and a control terminal coupled to a read word line, the first write transistor having a first terminal coupled to the first charge storage element, a second terminal coupled to a first write bit line, and a control terminal coupled to a write word line, the non-volatile memory cell comprising a control transistor and a non-volatile memory transistor, the control transistor having a first terminal coupled to the second terminal of the first read transistor, a second terminal, a control terminal coupled to a non-volatile word line, and a body terminal, the non-volatile memory transistor having a first terminal coupled to the second terminal of the control transistor, a second terminal coupled to a non-volatile bit line, a control terminal coupled to a non-volatile control line, and a body terminal coupled to the body terminal of the control transistor, and the method comprising:
 controlling the read word line to turn on the first read transistor for performing a read operation to the first charge storage element;
 when data stored in the first charge storage element is identified during the read operation, controlling the write word line to turn on the first write transistor for performing a program operation to the first charge storage element before the read operation is completed; and
 when performing a read operation to the non-volatile memory cell:
  inputting a ground voltage to the non-volatile control line, inputting a fifth voltage to the non-volatile word line, inputting the ground voltage to the read bit line, and inputting the ground voltage to the body terminal of the control transistor;
  controlling the read word line to turn off the first read transistor; and
  controlling the write word line to turn off the first write transistor;
wherein the program operation to the first charge storage element is started before the read operation to the first charge storage element is completed so the read operation and the program operation are performed simultaneously during a period of time; and
wherein the fifth voltage is greater than the ground voltage.

* * * * *